United States Patent [19]

Grandguillot et al.

[11] 4,394,747

[45] Jul. 19, 1983

[54] HIGH DENSITY INTEGRATED READ-ONLY MEMORY

[75] Inventors: Michel J. Grandguillot, Mennecy; Pierre B. Mollier, Boissise le Roi; Jean-Paul J. Nuez, Mennecy, all of France

[73] Assignee: International Business Machines Corp., Armonk, N.Y.

[21] Appl. No.: 213,289

[22] Filed: Dec. 5, 1980

[30] Foreign Application Priority Data

Dec. 7, 1979 [FR] France .................. 79 30422

[51] Int. Cl.³ ........................................ G11C 11/40
[52] U.S. Cl. ........................................ 365/104
[58] Field of Search .............. 365/94, 96, 103, 104, 365/179; 357/45

[56] References Cited

U.S. PATENT DOCUMENTS 4,328,563  5/1982  Schroeder ...................... 365/104

FOREIGN PATENT DOCUMENTS 2261594  9/1975  France .
2300395  9/1976  France .
2300396  9/1976  France .
2300397  9/1976  France .

OTHER PUBLICATIONS

IBM Technical Disclosure Bull., vol. 14, No. 11, Apr. 1972, p. 3245.
IEEE Journal of Solid State Circuits, vol. SC-5, No. 5, pp. 196-202, Oct. 1970.
Embinder, Semiconductor Memories, 1971, pp. 48-49.
IBM Technical Disclosure Bull., vol. 13, No. 9, Feb. 1971, p. 2770.

*Primary Examiner*—Robert L. Richardson
*Attorney, Agent, or Firm*—Robert J. Haase; John F. Ohlandt

[57] ABSTRACT

Integrated read-only memory including nxm memory cells located at the intersections of m bit lines and n word lines in which binary information of a first type is represented by the presence of a connection to a transistor in a cell, the base of said transistor being connected to a word line while its emitter is connected to a bit line, and in which binary information of a second type is represented by the absence of a connection to a transistor in a cell, said memory being of the type in which reading is ensured by means of m read transistors the emitters of which are connected to the bit lines while their bases are connected to a reference voltage supply, the improvement comprising read transistors arranged into k adjacent sets of m/k consecutive elements, k being an integer submultiple of m, the transistors of each set being provided in the same collector epitaxial bed in a semiconductor substrate with a collector contact common to all the transistors, the collector contact of each set being connected to a read circuit.

6 Claims, 7 Drawing Figures

HIGH DENSITY INTEGRATED READ-ONLY MEMORY

BACKGROUND OF THE INVENTION

1. Field of the Invention

This invention relates to a transistor read-only memory, and more particularly in such a memory, to a unique arrangement of the transistors making up the cells with the sensing transistors so as to obtain a very high storage density.

2. Background Art

Transistor read-only memories are well known in the art and widely used. Such a memory comprises orthogonal word lines and bit lines at the intersections of which memory cells are provided. Binary information of a first type, for instance a "1", is stored in a cell when said cell includes an active transistor, i.e. when the collector of said active transistor is connected to a biasing voltage supply, the base to the word line and the emitter to the bit line, while binary information of a second type, for instance a "0", is stored in a cell when said cell does not include any transistor or when the connections of the transistor to the various lines are not completed in the cell.

As background material for the present invention, reference may be made to French patent application 2 261 594, which relates to a programmable read-only memory including bipolar transistors which are connected or not through a fuse in the collector path, said memory being consistent with the well-known emitter coupled logic (ECL) circuits. Word line addressing is ensured by means of an addressing transistor the emitter of which is coupled with the emitters of the word line transistors. Additionally, reference may be made to French patent applications Nos. 2 300 395 and 2 300 397 which describe means allowing information to be written into a memory of the programmable type in which the emitters of the cell transistors are, or selectively are not, connected to the bit lines through resistors. Also French patent application No. 2 300 396 describes a memory of this type, including means to make the time required to access the information contained in the memory constant.

In the above-indicated patent applications, the information is sensed or detected by means of reading transistors the emitters of which are connected to the bit lines and which, therefore, make up current switches with the transistors of the selected memory cells. However, such applications are directed to improving the performance of read-only memory assemblies and not to improving density, i.e. storage capacity.

An object of this invention is to provide a very high density integrated read-only memory, requiring little power and of low cost.

SUMMARY OF THE INVENTION

This invention is implemented in a read-only memory integrated into a semiconductor master slice provided with m bit lines and n word lines. The memory cells are provided at the intersections of the word lines with the bit lines, which ensures a capacity of nxm bits. Base and collector contacts and diffusion regions are provided at each intersection. The base contact is connected to a word line and the collector contact is connected to the power supply. This memory is loaded by customizing the matrix of cells which is thus obtained, by providing the diffusion region and the emitter contact into the cells where a binary information of a first type, for instance a "1" is to be written, and by not providing said diffusion region and said emitter contact into the cells where a binary information of the second type, for instance a "0", is to be written. The emitter contacts are connected to the bit lines. Each bit line is connected to the emitter of a sensing transistor, the base of which is connected to a reference voltage, and the collector voltage of said sensing transistor indicates the state of the cell which is to be read and which has been selected through the word line.

In accordance with this invention, the bit lines are partitioned into k sets of m/k elements and consequently, the sensing transistors are partitioned into k sets of m/k elements. In order to minimize the gap between the bit lines and therefore, to ensure a higher density, the m/k elements of each set the collectors of which are connected in common to a reading circuit, are formed in the same sub-collector bed, which allows some surface to be gained in the silicon region and the collector capacitance to be reduced.

In addition, in accordance with another feature of the invention, m/k control circuits are used, each selecting circuit being connected to k bit lines, each bit line being taken from a different set. Thus, only k sensing transistors among the m transistors can be caused to conduct, which reduces power dissipation.

The foregoing and other objects, features and advantages of the invention will be apparent from the following more particular description of a preferred embodiment of the invention, as illustrated in the accompanying drawings.

DESCRIPTION OF PREFERRED EMBODIMENT

Figure 1:
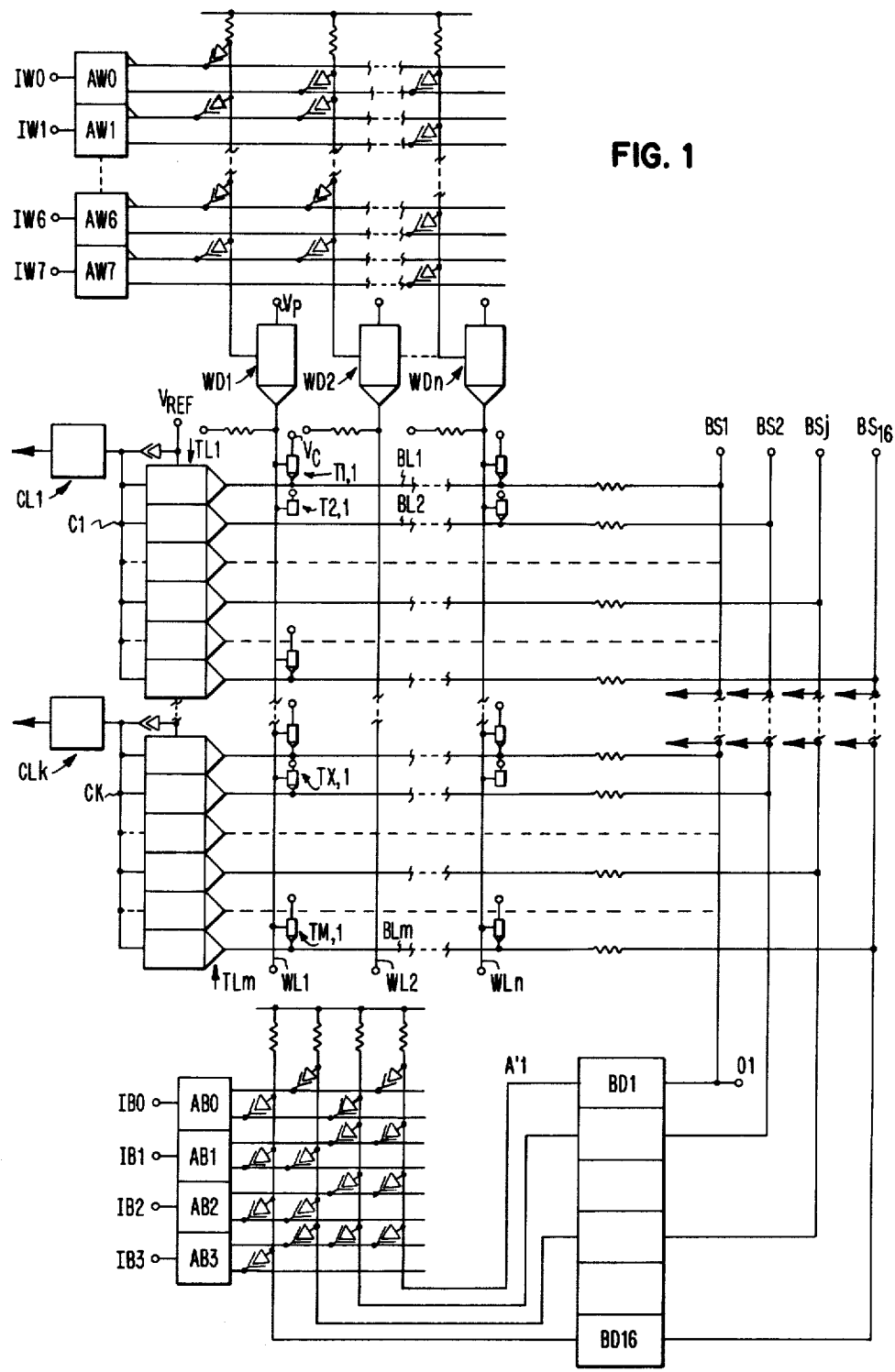
FIG. 1 is a schematic view of the read-only memory in accordance with this invention.

FIG. 1 shows the lay-out of a high density read-only memory in accordance with this invention. By using this lay-out, it is possible to integrate a memory with a density of nxm bits (n=256 and m=288) into a master-slice of standard dimensions.

The assembly includes transistors Ti, j arranged in a matrix of m rows and n columns. In Ti, j, i represents the transistor in the $i^{th}$ row and in the $j^{th}$ column. Vertical lines WL1 to WLn are the word lines and lines BL1 to BLm are the bit lines. Only the farthest lines of the assembly are shown.

Figure 2:
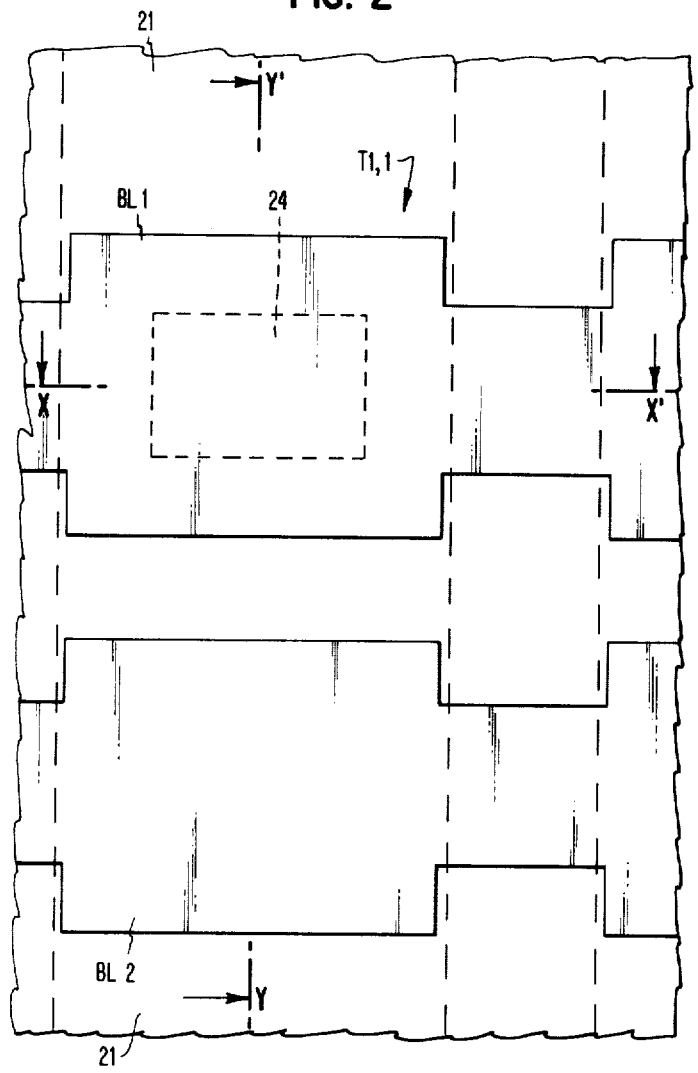
FIG. 2 is a top view of two of the integrated memory cells of FIG. 1 embodied in a master slice.

The collector of each transistor Ti, j is connected to biasing voltage supply Vc, and base is connected to a word line WLj and the emitter is provided or not. If it is provided, it is connected to a bit line BLi. For instance, the drawing shows that the emitter of transistor T1, 1 is connected to bit line BL1 and said transistor represents binary information of a first type, for instance a "1", and that transistor T2, 1 is not completed, i.e. its emitter is not provided. Therefore, it represents a binary information of a second type, for instance a "0". To load the memory with the desired information, a transistor with or without an emitter is provided at each point of the matrix. For this purpose, a particular transistor is completed or not by selectively diffusing an emitter region and establishing its contact into a master-slice in which the collector and the base have been diffused with the paired contacts in each location. The integration of two cells, the first one with an emitter and the second one without an emitter, is shown in FIG. 2.

A driving transistor WDj is associated with each word line WLj and controlled by the output (indicia j) of a decoder with $n=2^x$ outputs and x inputs. In the case of a memory with 256 word lines, n=256, x=8 and the decoder includes eight inputs IW0 to IW7 receiving the address of the line to be selected. The decoder is of a conventional type provided with Schottky diodes and is controlled by eight true value/complementary value generating circuits AW0 to AW7. Each generating circuit is provided with two outputs, the complementary value output bearing reference ▬. The sixteen output lines make up the horizontal lines of a Schottky diode matrix with n vertical lines which drive the base of transistors WD1 to WDn. The network provides a high level on the base of a particular transistor WDj corresponding to the selected word line and a low level on the other lines. This type of decoding circuit does not lay within the scope of the invention and will not be described in detail in this specification. It should be understood that other types of address decoders can be used.

The emitters of transistors WD1 to WDn are connected to word lines WL1 to WLn respectively and the collectors thereof are connected to a common biasing voltage supply Vp. One end of bit lines BL1 to BLm is connected to the emitters of sensing transistors TL1 to TLm. For purposes of clarity, all these transistors are not shown on the figure. The other ends are connected to 16 bit selection lines BS1 to BS16 through resistors in a way to be described later.

The sixteen bit selection lines BS1 to BS16 are addressed by sixteen bit line selection circuits BD1 to BD16 controlled by the sixteen outputs of an address decoder of the same type as the above described decoder for the word line selection, but provided with only four inputs IB0 to IB3 and four true value/complementary value generating circuits AB0 to AB3, the eight outputs of which make up the horizontal lines of Schottky diode matrix, the sixteen vertical lines of which drive decoders BD1 to BD16. It is possible to use any other type of decoder meeting the input level requirements of generators BD1 to BD16. Only one line BSj is to be selected at the low level while the other lines are at the high level.

Figure 5:
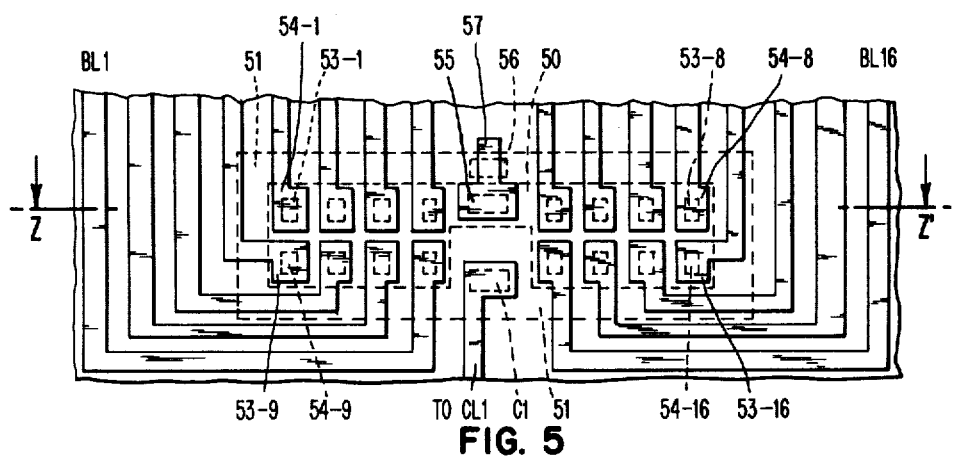
FIG. 5 is a top view of a set of master-slice sensing transistors.

In accordance with this invention, sensing or read resistors TL are arranged into k sets of m/k elements. In this example, k=18. The transistors of each set are provided in the same collector epitaxial bed. As shown in FIG. 5, the base region is common to all transistors of the same set and it is the same for the collector region. Therefore, only one collector contact C is connected to a read circuit CL. Point C1 of set 1 is connected to circuit CL1 and point Ck of set k is connected to circuit CLk.

The emitters of the first transistors of each set TL1, TL(1+m/k), TL(1+2m/k), ..., TL[1+(k−1m/k] are connected to line BS1. The emitters of the second transistors TL2, TL(2+m/k), etc., are connected to line BS2 and the emitters of the m/k$^{th}$ transistors TL16, TL(16+m/k) in this example, are connected to line BS16. This is schematically shown on FIG. 1 by the arrows issued from lines BS1 to BS16.

Reading is performed as follows. First of all, the word line with the information bits to be read is selected by a corresponding circuit. Let us assume that line 1 is selected by circuit WD1. In the same time frame, one of the lines BS1 to BS16 is selected by one of circuits BD1 to BD16 to read the required information on line 1. Let us take, for example, line BS2. BS2 being selected, those transistors T2, 1, T[2+m/k),1], T[2+(k−1)m/k,1] which have been provided with emitters are connected as current switches with the second read transistors in each of the sets, i.e. TL2, TL(2+m/k), TL[2+(k−1)m/k]. The emitters of those transistors T2,1,etc. are connected to a low level through line BS2. Consequently, for the switches in which a memory transistor is completed, for instance, Tx, 1, seen in FIG. 1 (near the bottom), the respective read transistor is OFF, which is detected by circuit CLk. For the switches in which a memory transistor is not completed, for instance T2, 1, the respective read transistor (TL2), is ON, which is detected by circuit CL1.

It will therefore be understood from the above described example that circuits CL1 to CLk indicate the state of all the second transistors of each set of the selected word.

Figure 4:
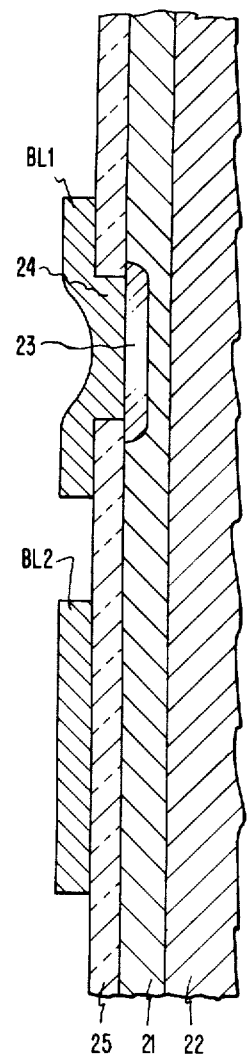
FIG. 4 is a cross section view taken along line YY' of FIG. 2.
Figure 3:
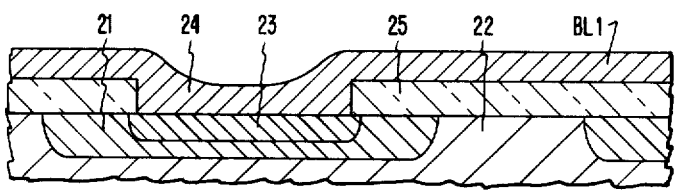
FIG. 3 is a cross section view taken along line XX' of FIG. 2.

FIG. 2 is a top view and FIGS. 3 and 4 are two cross sections of two memory cells. As shown in FIG. 2, transistors T1, 1 and T2, 1 are located in a same base diffusion region 21 (surrounded by dashed lines) which is provided in a collector epitaxial layer 22. When the transistor is completed, which is the case for T1, 1, an emitter region 23 is diffused into base region 21 with a metal contact 24 at this emitter region, as shown in the cross section views. When the transistor is not completed, which is the case for T2, 1, the emitter region is not present. Lines BL1 and BL2 are located above the semiconductor assembly separated by an oxide layer 25 through which the emitter contacts are provided when it is necessary. Horizontal lines BL1 and BL2 are provided at the first metal level since they can be directly connected to the silicon region at each cell. The vertical lines which are not shown, are connected to the silicon region only every eight cells. For instance, they are located at the second metal level; and, at every eight cells, a contact to the base is ensured through a via from the second to the first metal level. The particular metallurgical arrangement is not within the scope of this invention and will not be described in detail in this specification.

Figure 6:
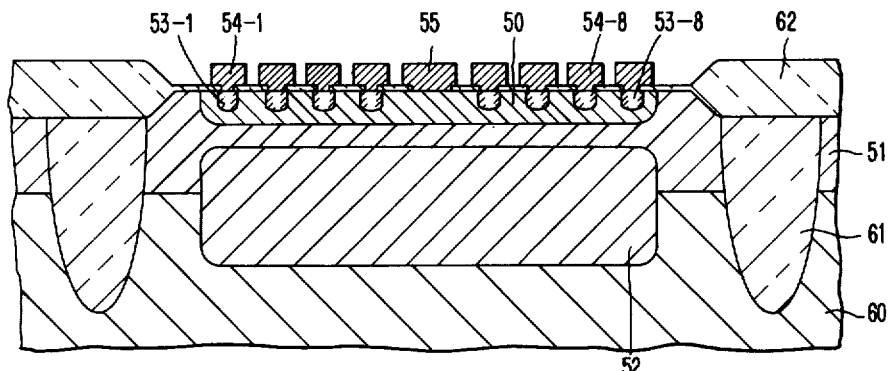
FIG. 6 is a cross section view taken along line ZZ' of FIG. 5.

FIGS. 5 and 6 show the arrangement of read transistors TL in each set, for instance in first set 1. The sixteen transistors are arranged into a common base diffusion region 50 diffused into a collector epitaxial region 51, which is associated with a sub-collector region 52. Two rows of eight emitter diffusion regions 53-1 to 53-8 and 53-9 to 53-16 are connected to lines BL1 to BL16 through respective associated contacts 54-1 to 54-8 and 54-9 to 54-16. The assembly includes a collector contact common to the sixteen transistors, which contact corresponds to point C1 of FIG. 1, with a line going to read circuit CL1; common base contact 55 is associated with a metal region 56 and a via 57 from the first metal level to the second metal level which is used to get the reference voltage through a metal region at the second level.

In an embodiment of this invention in which the transistors integrated in the matrix are of the NPN type, the read transistors are also of the NPN type. Consequently, they are integrated into a substrate 60 of the P type. The set of sixteen transistors is isolated by an isolation wall 61 of the P+ type, seen in FIG. 6. Subcollector region 52 is of the N+ type. Collector region 51 is of the N type while base region 50 is of the P type and emitter regions 53 of the N+ type. An oxide layer 62 is provided on the surface of the assembly and the contacts are provided through this layer 62.

The arrangement of this invention provides good temperature compensation and ensures close tracking of the current variations between the cell transistors and the read transistor, since they follow the same lay-out. Since only a part of the current sources is put into operation by selecting one of lines BS1 to BS16, power dissipation is considerably reduced. Furthermore, the integration of sixteen read transistors as a set allows some surface to be saved and the read transistor collector capacity to be reduced. The pitch of the memory is also determined only by the cell transistors. When k=18, this pitch can be set to 8.2 microns in the embodiment described in this example.

Figure 7:
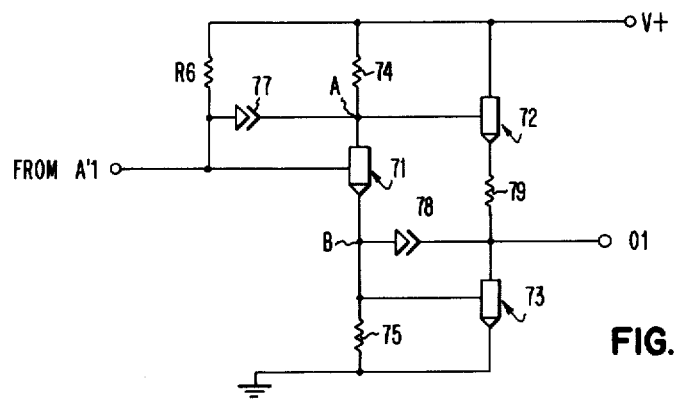
FIG. 7 is a schematic view of a drive circuit BD of FIG. 1.

FIG. 7 shows one of circuits BD1 to BD16 used for selecting a line BS1 to BS16; for instance, circuit BD1 which receives the signal from selecting decode circuit, A'1 (see FIG. 1). This circuit includes three transistors 71,72,73. The base of transistor 71 is connected to output A'1, its collector is connected to a voltage +V supply through a resistor 74 and its emitter is grounded through a resistor 75. A resistor R6 is provided between the voltage +V supply and the base of transistor 71. The anode of a Schottky diode 77 is connected to the base of transistor 71 and its cathode is connected to the collector of transistor 71 at point A.

Point A is connected to the base of transistor 72 the collector of which is connected to the voltage +V supply and the emitter is connected to the collector of transistor 73 through resistor 79. Point B at the emitter of transistor 71 is connected to the anode of a Schottky diode 78 the cathode of which is connected to the collector of transistor 73. The emitter of transistor 73 is grounded. Point 01 is taken from the collector of transistor 73.

The circuit operates as follows. First stage 71 is a phase shifting stage which puts signals A and B into opposite phase in order to be able to drive the output push-pull. A high level signal coming from A'1 causes transistor 71 to be ON. The potential at point B increases by IVBE which is the base-emitter potential of a transistor. As transistor 71 is on, its anti-saturation diode 77 is on and the potential at point A is equal to the input potential minus the voltage of diode 77, i.e. 1 volt. Therefore, transistor 73 is ON. A current of a few hundred microamps controlled by resistor 79 goes through transistor 72. Transistor 73 is of great dimensions and is able to control high voltage to ground, its base current being more or less equal to 1 milliamp. As a result of transistor 73 being turned ON, line BS1 is selected.

On the other hand, a low level signal from A'1 switches off transistors 71 and 73. Transistor 73 discharges its base current into resistor 75. The voltage at point A increase towards +V. The emitter of transistor 72 follows the potential of point A. Therefore, line BS1 is not selected.

While there has been described what is at present considered to be the preferred embodiment of this invention, it will be obvious to those skilled in the art that various changes and modifications may be made therein without departing from the invention, and it is, therefore, intended to cover all such changes and modifications as fall within the true spirit and scope of the invention.

What is claimed is:

1. Integrated read-only memory including nxm memory cells located at the intersections of m bit lines and n word lines in which binary information of a first type is represented by the presence of a connection to a transistor in a cell, the base of said transistor being connected to a word line while its emitter is connected to a bit line, and in which binary information of a second type is represented by the absence of connection to a transistor in a cell, said memory being of the type in which reading is ensured by means of m read transistors the emitters of which are connected to the bit lines while their bases are connected to a reference voltage supply, the improvement comprising read transistors (TL) arranged into k adjacent sets of m/k consecutive elements, k being an integer submultiple of m, the transistors of each set being provided in the same collector epitaxial bed (51) in a semiconductor substrate with a collector contact (C1) common to all the transistors, the collector contact of each set being connected to a read circuit (CL).

2. Integrated read-only memory according to claim 1, in which in each of said sets, the base region (50) is common to all the transistors in that set, and one base contact (55) is provided to ensure the connection to the reference voltage supply.

3. Integrated read-only memory according to claim 1, in which there is further included m/k bit selection lines BSi with $1 \leq i \leq m/k$, each bit selection line being connected to k bit lines so that the emitters of the $i^{th}$ read transistors of each set are connected to each line BSi.

4. Integrated read-only memory according to claim 1, in which there is included n word line selecting circuits, each selecting circuit being capable of selecting a word line so as to read the information contained therein.

5. Integrated read-only memory according to claim 1, in which there is included m/k bit line selecting circuits with $1 \leq i \leq m/k$ able to select one of the lines (BS) with a chosen address, each circuit being provided with inputs receiving the chosen address information and with an output connected to a bit selecting line to select the line with the chosen address.

6. Integrated read-only memory according to claim 1, in which the memory cell transistors and the read transistors are of the NPN type.

* * * * *